(12) United States Patent
Lin et al.

(10) Patent No.: US 8,230,311 B2
(45) Date of Patent: Jul. 24, 2012

(54) METHOD AND APPARATUS FOR TURBO CODE DECODING

(75) Inventors: Cheng-Hung Lin, Taipei County (TW); An-Yu Wu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 1120 days.

(21) Appl. No.: 12/112,175

(22) Filed: Apr. 30, 2008

(65) Prior Publication Data

US 2009/0172502 A1  Jul. 2, 2009

(30) Foreign Application Priority Data

Dec. 31, 2007  (TW) ................................ 96151435 A

(51) Int. Cl.
*H03M 13/03* (2006.01)

(52) U.S. Cl. ........................................ 714/795; 714/794

(58) Field of Classification Search .................... None
See application file for complete search history.

(56) References Cited

U.S. PATENT DOCUMENTS

| | | | |
|---|---|---|---|
| 7,032,156 B2 | 4/2006 | Yu et al. | |
| 7,116,732 B2* | 10/2006 | Worm et al. | 375/341 |
| 7,209,527 B2 | 4/2007 | Smith et al. | |
| 2003/0002603 A1* | 1/2003 | Worm et al. | 375/341 |
| 2003/0014712 A1* | 1/2003 | Yano et al. | 714/786 |
| 2003/0084398 A1 | 5/2003 | Nguyen | |
| 2005/0034051 A1* | 2/2005 | Chun et al. | 714/795 |
| 2005/0120287 A1* | 6/2005 | Wu et al. | 714/795 |
| 2005/0149838 A1* | 7/2005 | Chiueh et al. | 714/795 |
| 2005/0193308 A1* | 9/2005 | Shin | 714/752 |
| 2005/0278603 A1* | 12/2005 | Berens et al. | 714/755 |
| 2007/0033510 A1 | 2/2007 | Xu | |
| 2007/0055919 A1 | 3/2007 | Li et al. | |
| 2007/0153693 A1* | 7/2007 | Takanashi | 370/232 |
| 2007/0220409 A1* | 9/2007 | Shao et al. | 714/795 |
| 2009/0313531 A1* | 12/2009 | Ashley et al. | 714/792 |
| 2009/0319875 A1* | 12/2009 | Ashley et al. | 714/792 |

FOREIGN PATENT DOCUMENTS

TW    200518475    6/2005

OTHER PUBLICATIONS

Dong-Soo Lee et al., "Low-Power Log-MAP Decoding Based on Reduced Metric Memory Access," IEEE Transactions on Circuits and Systems, Jun. 2006, pp. 1244-1253, vol. 53, No. 6, IEEE, US.
Tsung-Han Tsai et al., "A Memory-Reduced Log-MAP Kernel for Turbo Decoder," May 2005, pp. 1032-1035, IEEE International Symposium on Circuits and Systems, US.

* cited by examiner

*Primary Examiner* — Guerrier Merant

(57) ABSTRACT

A method and apparatus for turbo code decoding are provided to reduce memory consumption during calculation of state metrics. In an embodiment of a turbo code decoder, a natural recursion unit comprises a plurality of add-compare-select (ACS) units performing natural recursion operations to generate a state metric. The original state metric is then converted to a differential metric before being stored into a memory device. The differential metric contains less data than the state metric so that memory consumption is reduced. To restore the original state metric from the differential metric, a plurality of revival units operating in parallel is provided. Thereby, the state metric is reacquired from the differential metric, and a Log Likelihood Recursion (LLR) operation is accordingly performed by an LLR unit.

21 Claims, 10 Drawing Sheets

METHOD AND APPARATUS FOR TURBO CODE DECODING

CROSS REFERENCE TO RELATED APPLICATIONS

This application claims priority of Taiwan Patent Application No. 96151435, filed on Dec. 31, 2007, the entirety of which is incorporated by reference herein.

BACKGROUND OF THE INVENTION

1. Field of the Invention

The invention relates to wireless communication, and more particularly to a turbo code decoding method.

2. Description of the Related Art

Wideband wireless communications infrastructure and applications have been widely developed in recent years. One such example is the WiMAX system. The WiMAX standard adopt the convolutional turbo code (CTC) as one of Forward Error Correction (FEC) mechanisms. CTC provides high performance for telecommunications, and there have been various CTC related enhancements and developments proposed as prior arts. FIG. 1 shows a conventional turbo code decoder 100, essentially comprising a pair of decoding units 110 and 120. The decoding unit 120 receives a transmission signal #IN and a decoding result from the decoding unit 110 via an extrinsic information interleaver 102 and a data interleaver 104 to perform a recursive calculation. Symmetrically, through a deinterleaver 106, the decoding unit 120 feeds back a decoding result to the decoding unit 110, such that the decoding unit 110 performs a recursive calculation based on the decoding result and the transmission signal #IN. The transmission signal #IN is typically provided by a transmitter, and contains various channel effect and noise interferences. The recursive calculation processed in the decoding unit 110 and 120 may be one of various algorithms, such as a log-maximum a posterior (Log-MAP) algorithm, a Maximum Log-MAP algorithm or an Enhanced Maximum Log-MAP algorithm. The algorithms are also referred to as Soft-in-Soft-out (SISO) decoding algorithms.

FIG. 2a shows a binary trellis structure of conventional state metrics. The horizontal axis t represents time or stage, and the vertical axis represents multiple states within each stage. As an example, state $S_1$ and $S_2$ corresponding to stages $t_{i-1}$ and $t_i$ are shown in FIG. 2a. Generally, three parameters are required for the SISO decoding algorithms, the forward probability $\alpha$, backward probability $\beta$ and branch probability $\gamma$ for each state. Taking the state $S_1$ at stage $t_{i-1}$ for example, the parameters are referred to as $\alpha_1(t_{i-1})$ and $\beta_1(t_{i-1})$. The state $S_1$ at stage $t_{i-1}$ may be switched to state $S_1$ or $S_2$ at stage $t_i$, so that there are two branches each having a probability (or weighting factor) derivable from the received signals, denoted as $\gamma(S_1,S_1)$ and $\gamma(S_1,S_2)$. Identically, for the state $S_2$ at stage $t_{i-1}$, corresponding parameters comprise $\alpha_2(t_{i-1})$, $\beta_2(t_{i-1})$, $\gamma(S_2,S_1)$ and $\gamma(S_2,S_2)$. According to MAP algorithm, the forward probability $\alpha$ of the state $S_1$ at stage $t_i$ is obtained from the forward probabilities $\alpha$ and branch probabilities $\gamma$ of the previous stage $t_{i-1}$, and the backward probability $\beta$ of stage $S_1$ at stage $t_{i-1}$ is obtained from the backward probabilities $\beta$ and branch probabilities $\gamma$ at the next stage $t_i$. Detailed introductions for the algorithms are available in public journals, thus further description is omitted herein. To process the algorithms, in the decoding units 110 and 120, however, significant memory space is required to buffer all the parameters related to a state metric. For example, each parameter may be a 10-bit float value, and if there are N states at each stage, and the state metric is a single binary trellis structure, there would be $2^N$ branches to be managed. In other words, the memory requirement increases exponentially with the number of stages N.

FIG. 2b shows a conventional Add-Compare-Selection (ACS) circuit adapted in the decoding units 110 and 120 of FIG. 1, used for recursively calculating the probabilities $\alpha$ and $\beta$ for each state. As an example, if the forward probability $\alpha_1(t_i)$ of state $S_1$ at stage $t_i$ is to be calculated, all the associated states of a previous stage and branches therefrom would be considered. In this case, probabilities $\alpha_1(t_{i-1})$ and $\alpha_2(t_{i-1})$ are considered. First, the adder 202 adds the forward probability $\alpha_1(t_{i-1})$ to the branch probability $\gamma(S_1,S_2)$, and the adder 204 adds the forward probability $\alpha_2(t_{i-1})$ to the branch probability $\gamma(S_1,S_2)$. Thereafter, the added results are sent to the selector 210 for comparison, among which the larger value is output to the adder 206 to be added with a value from the lookup table 220 so that the forward probability $\alpha_1(t_i)$ is generated. The lookup table 220 is a table comprising fixed values, providing logarithm corrections for the values output from the adders 202 and 204. Since the lookup table 220 is a prior art, a detailed description is omitted herein.

According to the aforementioned approaches, the probabilities $\alpha$ and $\beta$ of each state are calculated by the ACS circuit 200, so that the ACS circuit 200 and the memory device are recursively used. The total of parameters $\alpha$ and $\beta$ therefore establish a state metric in the memory device, and when the state metric is established, a Log Likelihood Ratio (LLR) calculation is processed in the decoding units 110 and 120 to calculate a decoding result which has a maximum probability.

BRIEF SUMMARY OF THE INVENTION

An exemplary embodiment of a turbo code decoder is provided. In which, a state processor comprises a plurality of Add-Compare-Selection (ACS) units operating concurrently to perform a natural recursion operation on an input sequence to generate a state metric, and to convert the state metric into a differential metric. A memory device is utilized for storage of the differential metric. A plurality of revival units are provided, operating concurrently to re-acquire the state metric from the differential metric. A likelihood calculator performs a log likelihood ratio (LLR) calculation based on the state metric. Specifically, the state metric is a radix-4 trellis structure or a radix-$2^2$ trellis structure.

The state metric comprises a plurality of state vectors each associated with a stage, and each state vector comprises a plurality of states. The differential metric comprises a plurality of differential vectors each associated with a state vector. In each differential vector, at least one revival parameter represents a dominant state in the state vector, and a plurality of differential values are to re-acquiring other states from the dominant state.

When the revival unit re-acquires the state metric, the dominant state is first re-acquired from the revival parameter, and the other states are re-acquired based on the dominant state and the differential values.

The natural recursion operation utilizes a log-maximum a posterior (Log-MAP) algorithm, a Maximum Log-MAP algorithm or an Enhanced Maximum Log-MAP algorithm. The state may represent a forward probability or a backward probability, and the revival unit may recursively re-acquire each state vector in a forward order or a backward order. The likelihood calculator is utilized to derive log likelihood ratios (LLRs) among the state metric.

Another embodiment provides a turbo code decoding method implemented in the aforementioned turbo code decoder, and a detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
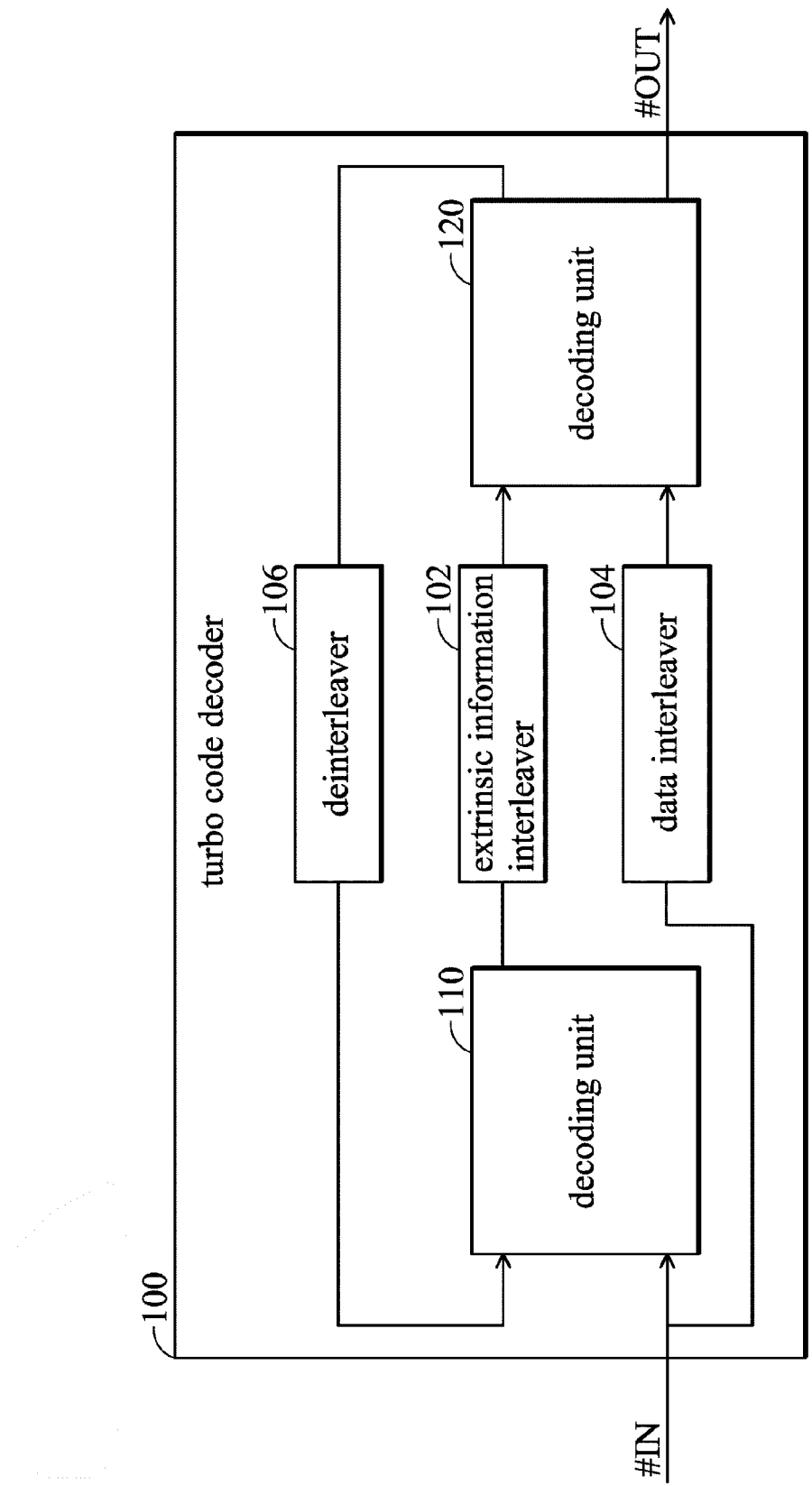
FIG. 1 shows a conventional turbo code decoder.
Figure 2A:
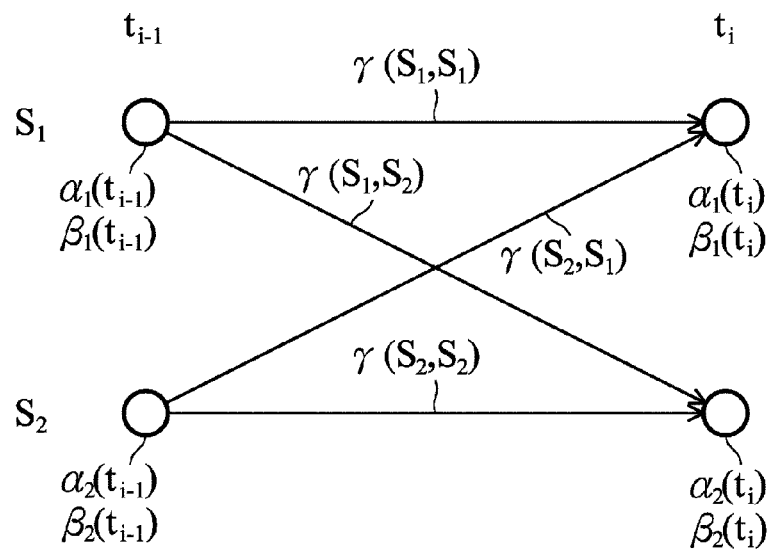
FIG. 2a shows a binary trellis structure.
Figure 2B:
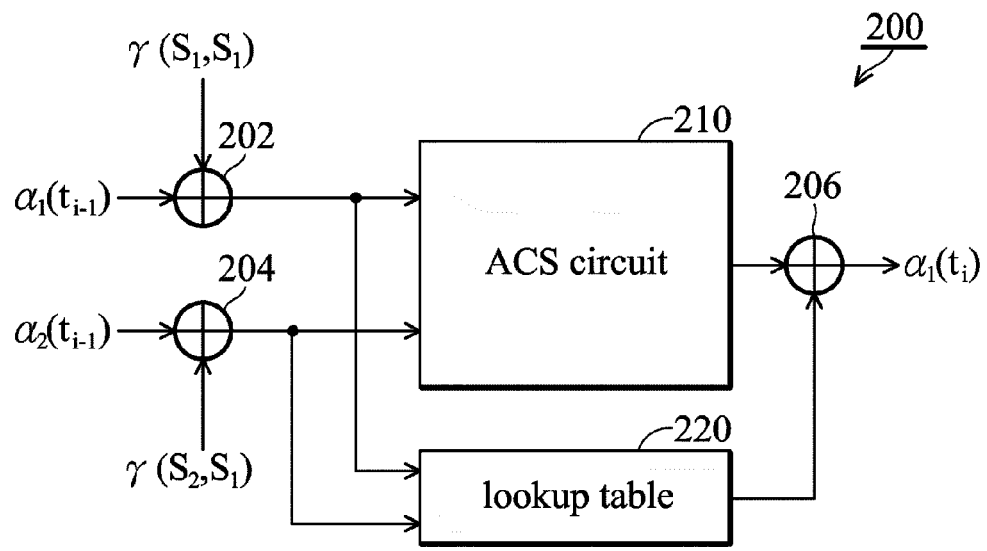
FIG. 2b shows a conventional ACS circuit.
Figure 3:
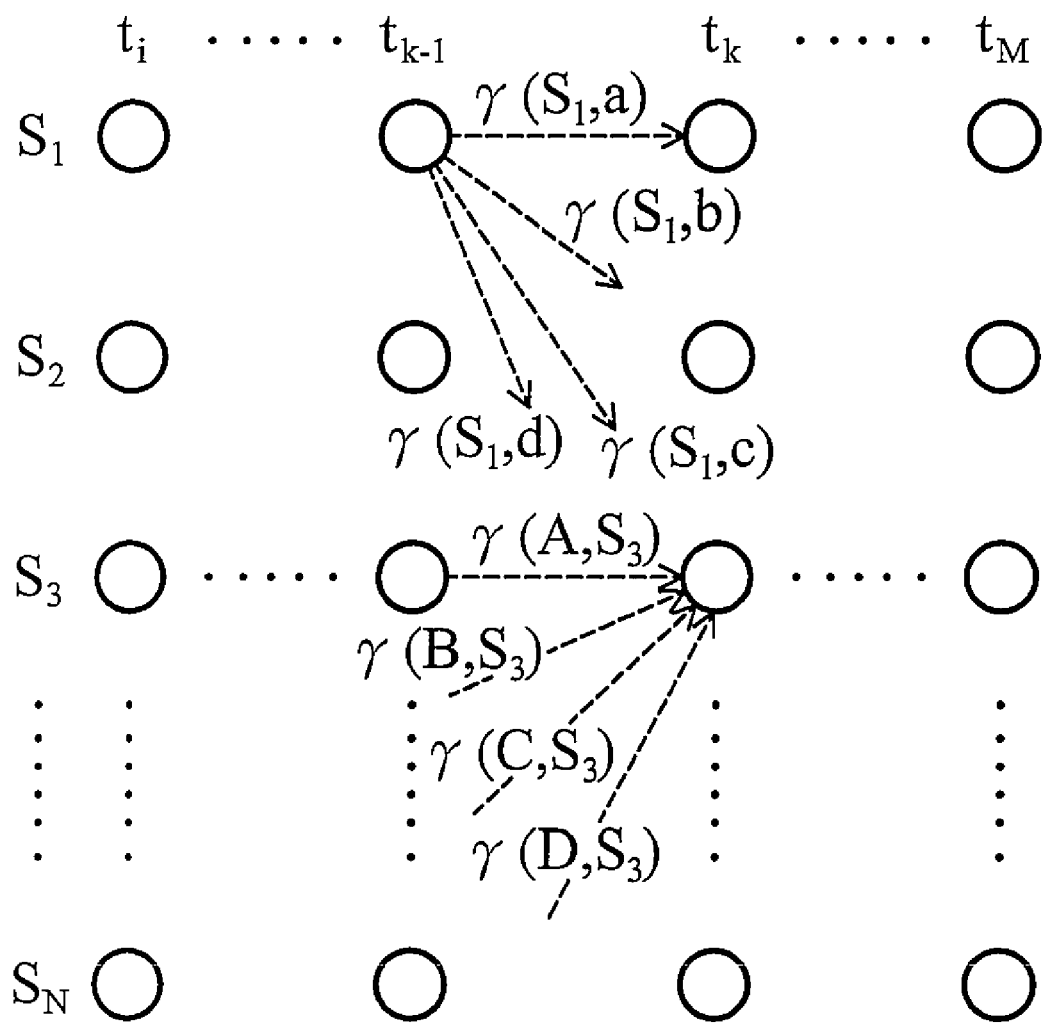
FIG. 3 shows a radix-4 trellis structure of state metrics.

FIG. 3 shows a radix-4 trellis structure of state metrics, and an embodiment is described based thereon. Basically, a state metric comprises a plurality of state vectors corresponding to stages $t_1$ to $t_M$, and each state vector comprises N states $S_1$ to $S_N$. Taking the state $S_1$ at stage $t_{k-1}$ for example, since the trellis is radix 4, there are four possible branches connecting the state $S_1$ to the next stage. Specifically, the pairs of states connected by the branches between two stages are previously defined in the trellis structure standards. In the embodiment, four branches initiated from the state $S_1$ at current stage are individually destined to states a, b, c and d at a next stage, each carrying a branch probability $\gamma(S_1,a)$, $\gamma(S_1,b)$, $\gamma(S_1,c)$ and $\gamma(S_1,d)$. Conversely, each state at a current stage may come from one of four states at a previous stage. For example, the state $S_3$ at stage $t_k$ has four branches associated with four states A, B, C and D at a previous stage (not shown), each carrying a branch probability $\gamma(A,S_3)$, $\gamma(B,S_3)$, $\gamma(C,S_3)$ and $\gamma(D,S_3)$. Based on the MAP algorithm, the process to calculate the state metric is conclusively referred to as a natural recursion operation, with each stage element representing a forward probability or a backward probability. A proceeding Log Likelihood Ratio (LLR) calculation may only be performed when all the probability values are acquired.

Figure 4:
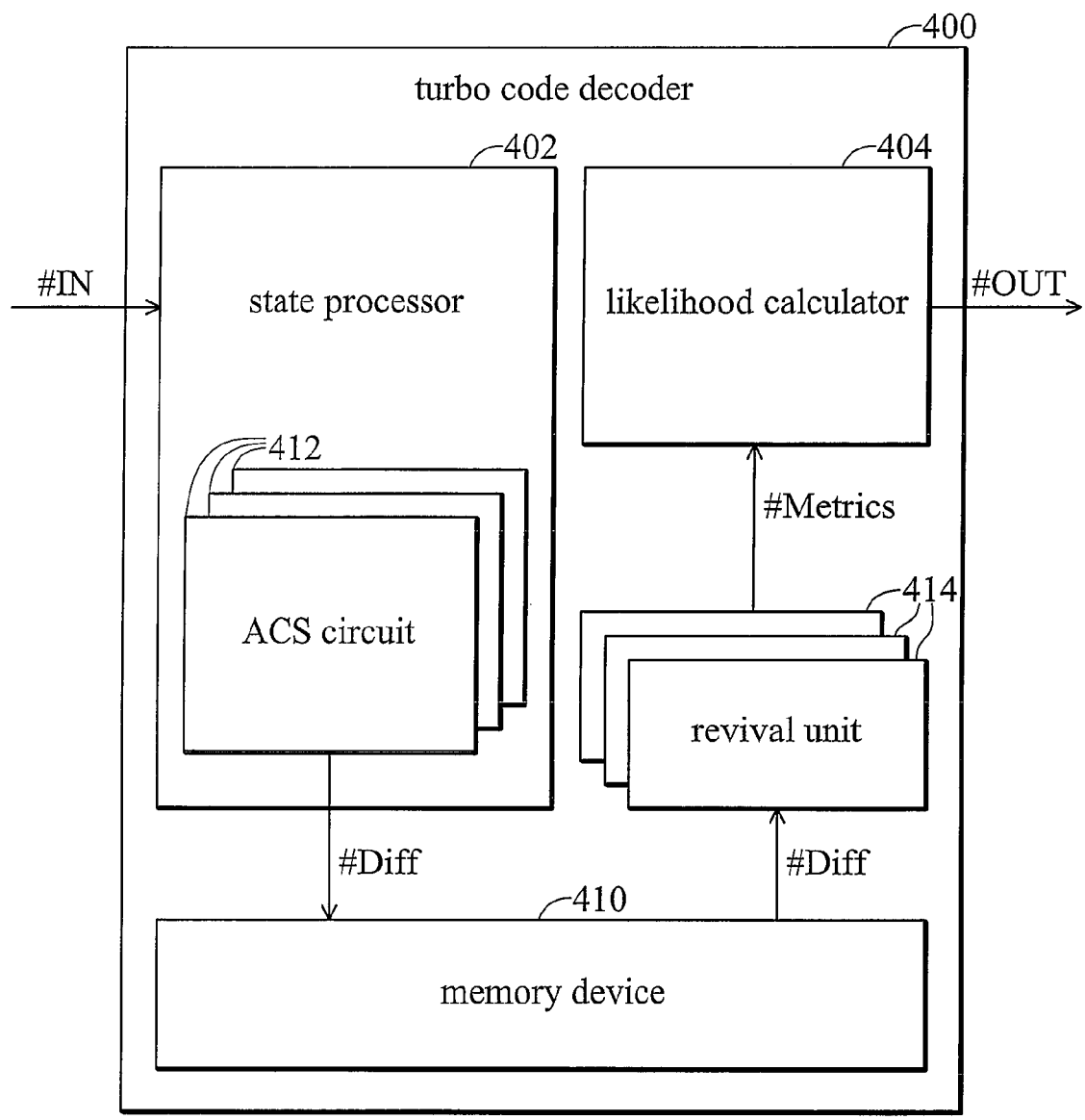
FIG. 4 shows an embodiment of a decoding unit 400.

FIG. 4 shows an embodiment of a decoding unit 400 according to the invention. To reduce memory occupation, the decoding unit 400 is proposed to calculate the state metric for the decoding units 110 and 120. The decoding unit 400 mainly comprises a state processor 402 and a likelihood calculator 404. The state processor 402 comprises a plurality of ACS circuits 412 operating in concurrence, performing the natural recursion operation based on a transmission signal #IN to generate the state metric #Metrics. In the embodiment, the ACS circuit 412 converts the state metric #Metrics into a differential form, which is stored in the memory device 410 as a differential metric #Diff so that memory occupation can be reduced. Before the likelihood calculator 404 performs an LLR operation, a plurality of revival units 414 are utilized to read the memory device 410 to re-acquire the state metric #Metrics from the differential metric #Diff.

In the decoding unit 400, the algorithm adapted to perform the natural recursion operation may be one from the prior arts, such as a Log-MAP algorithm, a Maximum Log-MAP algorithm or an Enhanced Maximum Log-MAP algorithm, and the likelihood calculator 404 is utilized to calculate log likelihood ratios of all paths presented in the state metric. The decoding unit 400 is particularly adaptable for a state metric of a radix-4 trellis structure or a radix-$2^2$ trellis structure.

Figure 5A:
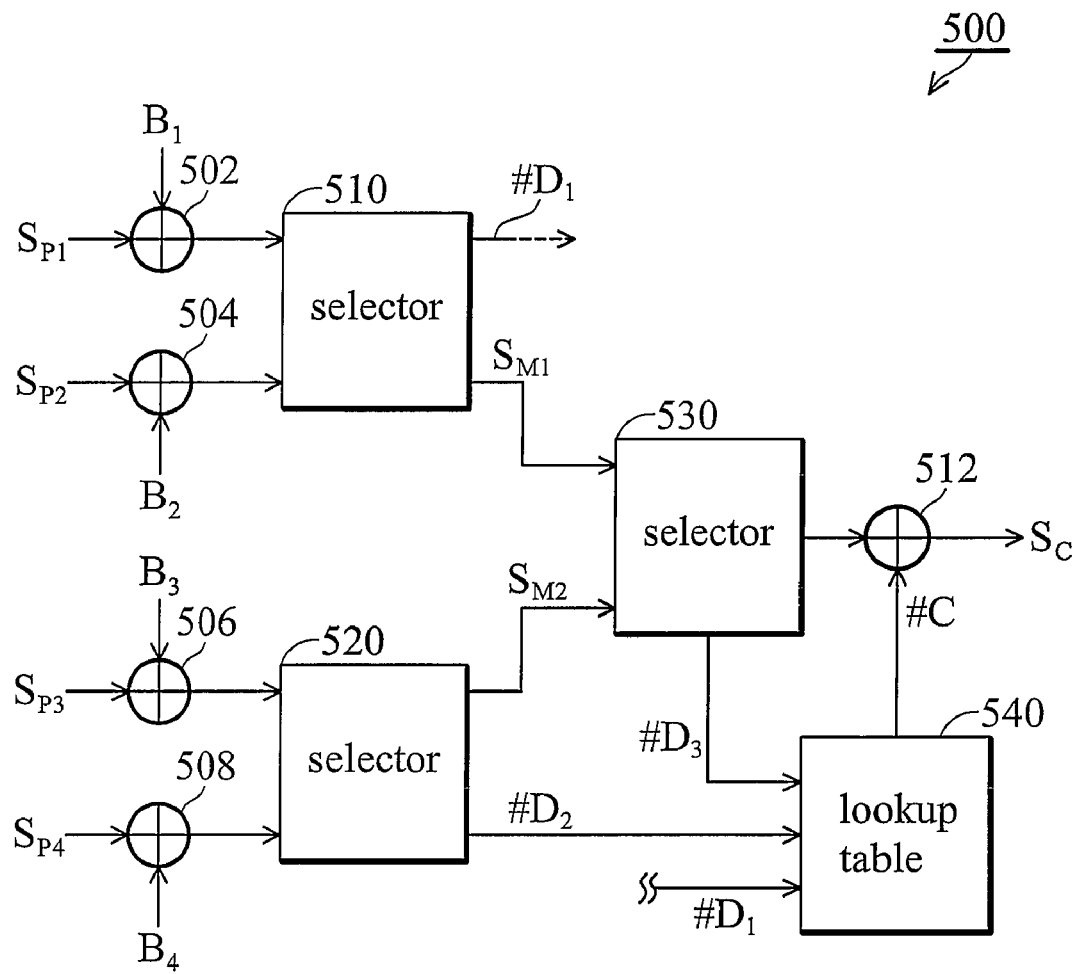
FIG. 5a shows an embodiment of an ACS circuit 500.

There may be various circuit implementations to convert the state metric into a differential metric, and FIG. 5a shows an exemplary embodiment of an ACS circuit 500. Each state has a value, and through four adders 502, 504, 506 and 508, the ACS circuit 500 adds four state values $S_{P1}$, $S_{P2}$, $S_{P3}$ and $S_{P4}$ respectively with corresponding branch values $B_1$, $B_2$, $B_3$ and $B_4$ to generate four candidates. Thereafter, three selectors 510, 520 and 530 are utilized to obtain a state value $S_C$ corresponding to a state of a current stage. More specifically, the state value $S_C$ is the largest value among the four candidate values. Conventionally, the state values $S_{P1}$, $S_{P2}$, $S_{P3}$ and $S_{P4}$ are then directly sent to the memory device for storage. In the invention, alternatively, the state values are not directly stored, but converted to difference values. For example, the selector 510 first compares the outputs from adders 502 and 504, among which a larger value is selected and sent to the selector 530, with their difference value #$D_1$ stored in the memory device 410. Likewise, the selector 520 compares the outputs from adders 506 and 508, passes the larger value to the selector 530, and stores their difference value #$D_2$ in the memory device 410. Furthermore, the selector 530 receives the two values sent from the selectors 510 and 520, selects a larger value, and calculates their difference value #D3. In other words, the output from the selector 530 is the maximum of the four candidates. A lookup table 540 may be looked up for a logarithm correction value #C based on the difference values #D1, #D2 and #D3, and an adder 512 then adds the logarithm correction value #C to the maximum candidate to generate the state value $S_C$. When all state values $S_C$ of a current stage are acquired, the ACS circuit 500 can be recursively reused to calculate state values $S_C$ of a next stage. In this way, every four state values are simplified into three differential values each carrying a sign bit, thus, it is possible to re-acquire the original state values from the three differential values by simple logics. In comparison to storage of four state values, memory occupation is significantly reduced by storing only three differential values.

Figure 5B:
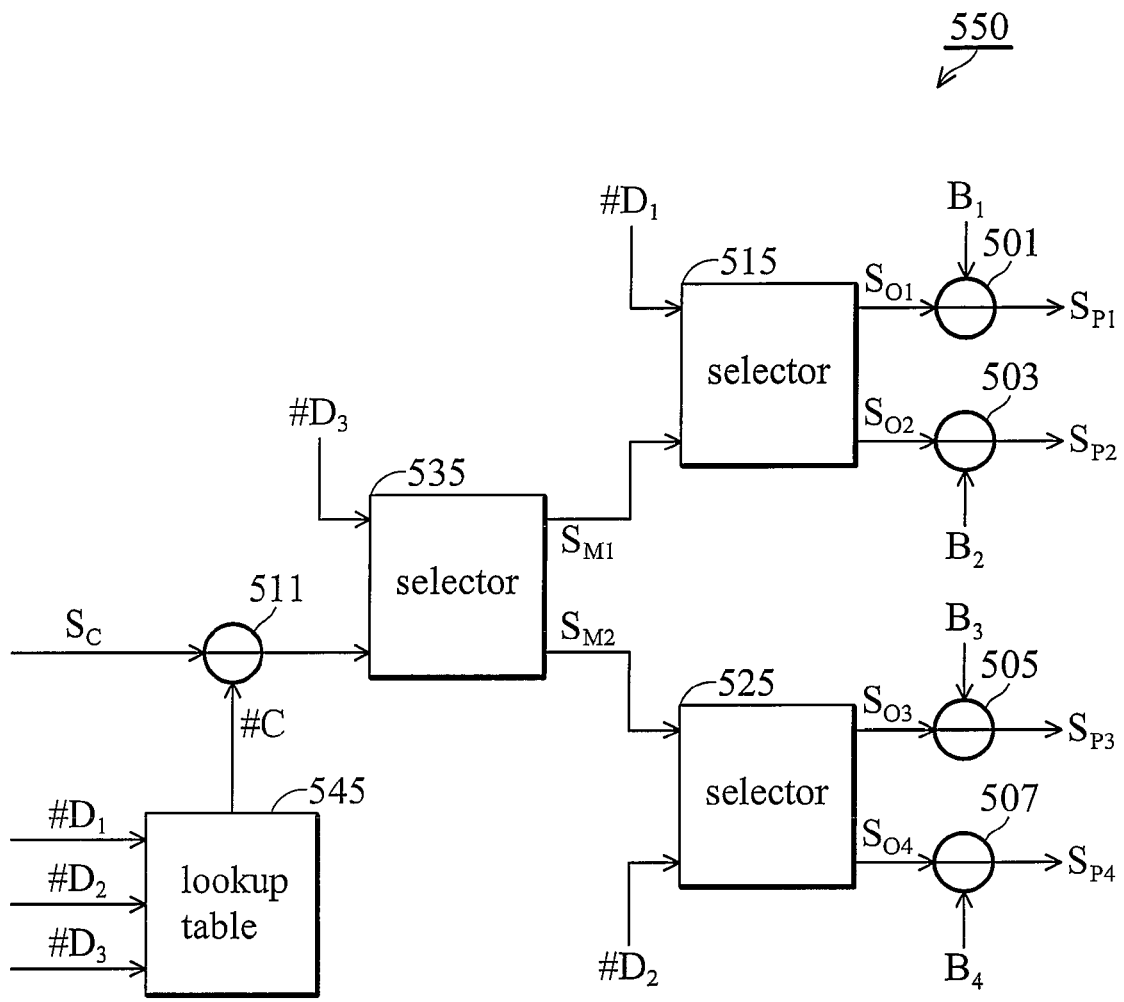
FIG. 5b shows an embodiment of a revival unit 550.

FIG. 5b shows an embodiment of a revival unit 550. The revival unit 550 is basically symmetric to the ACS circuit 500. One state value $S_C$ and three difference values #D1, #D2 and #D3 are input to the revival unit 550, thereby four state values of a previous stage $S_{P1}$, $S_{P2}$, $S_{P3}$ and $S_{P4}$ are re-acquired. First, the lookup table 545 is looked up for a logarithm correction value #C based on the difference values #D1, #D2 and #D3 stored in the memory device 410. A subtractor 511 then subtracts the state value $S_C$ by the logarithm correction value #C and sends the result to a selector 535. Actually, the result is exactly the maximum of the four candidates mentioned in FIG. 5a. The selector 535 generates two intermediate values $S_{M1}$ and $S_{M2}$ from the maximum candidate based on the difference value #D3. As described in FIG. 5a, the maximum candidate is chosen from one of the intermediate values $S_{M1}$ and $S_{M2}$, so in FIG. 5b, the selector 535 assesses one of the intermediate values $S_{M1}$ and $S_{M2}$ to be the maximum candidate, and the other one to be the maximum candidate minus the difference value #D3. The sign bit of the difference value #D3 determines which intermediate value should be assessed to be the maximum candidate. Based on the same logic, the selector 515 uses the difference value #D1 to re-acquire candidates $S_{O1}$ and $S_{O2}$ from the intermediate value $S_{M1}$, and the selector 525 uses the difference value #D2 to re-acquire candidates $S_{O3}$ and $S_{O4}$ from the intermediate value $S_{M2}$. A pair of subtractors 501 and 503 individually subtract the candidates $S_{O1}$ and $S_{O2}$ by the branch values $B_1$ and $B_2$ to re-acquire state values $S_{P1}$ and $S_{P2}$ at a previous stage, and a pair of subtractors 505 and 507 individually subtract the candidates $S_{O3}$ and $S_{O4}$ by the branch values $B_3$ and $B_4$ to re-acquire the state values $S_{P3}$ and $S_{P4}$ at a previous stage.

Figure 5C:
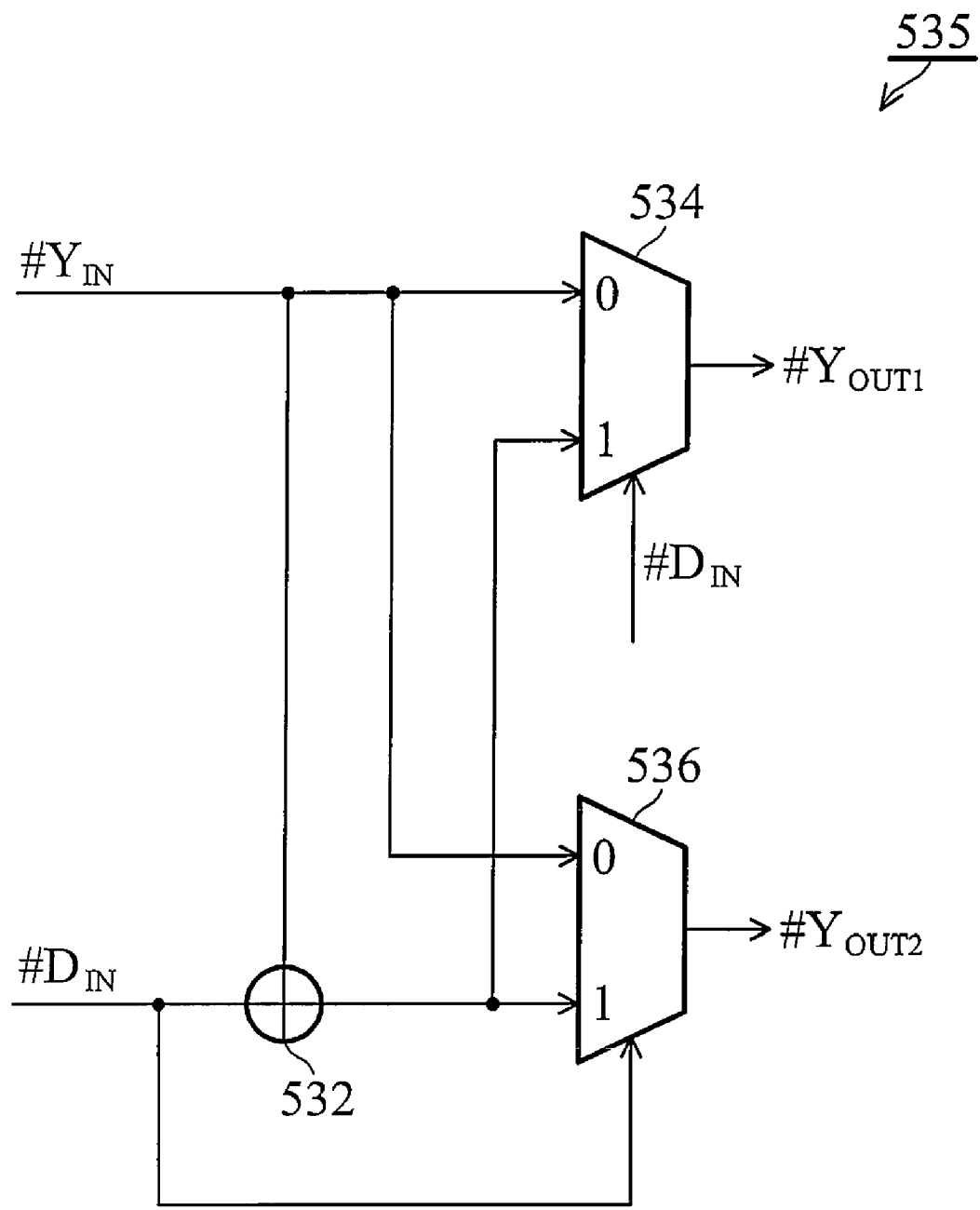
FIG. 5c shows an embodiment of a first selector according to FIG. 5b.

There are various ways to implement the logic circuit, and FIG. 5c shows an embodiment of the selectors 515, 525 and 535 mentioned in FIG. 5b. The selector 535 may comprise a pair of multiplexers 534 and 536. The input is a base value $\#Y_{IN}$ and a difference value $\#D_{IN}$, and the outputs are $\#Y_{OUT1}$ and $\#Y_{OUT2}$. One of the output values $\#Y_{OUT1}$ and $\#Y_{OUT2}$ is assessed to be the base value $\#Y_{IN}$, and another is the $\#Y_{IN}$ minus the difference value $\#D_{IN}$. The sign bit of the difference value $\#D_{IN}$ determines whether the $\#Y_{IN}$ should be output through the multiplexer 534 or the multiplexer 536. The operator 532 may be capable of performing a specific operation, such as absolutizing the difference value $\#D_{IN}$ and subtracting the $\#Y_{IN}$ by the $\#D_{IN}$.

Figure 6A:
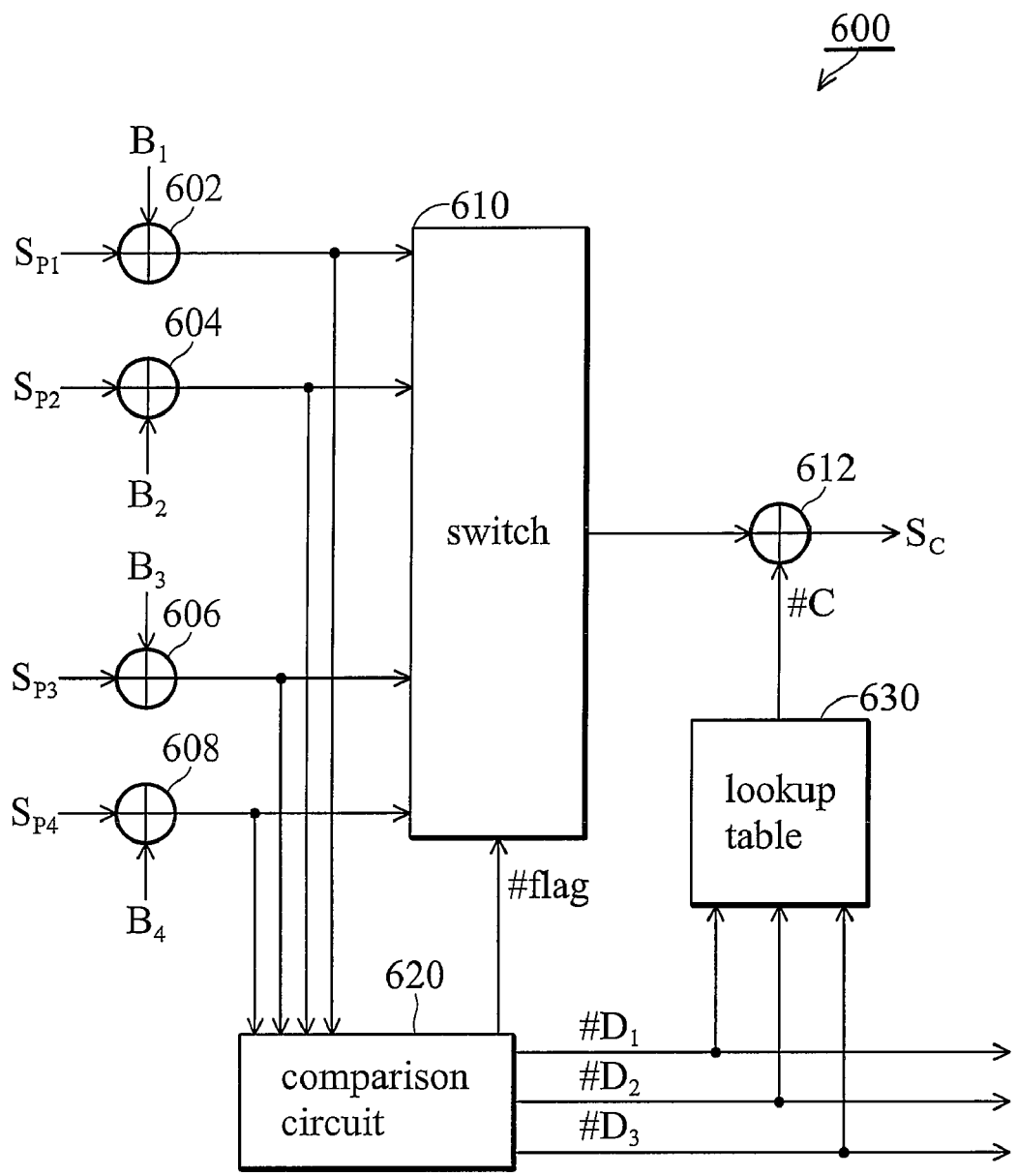
FIG. 6a shows an embodiment of an ACS circuit 600.

FIG. 6a shows another embodiment of an ACS circuit 600. When producing the state values $S_C$ of a current stage, the adders 602, 604, 606 and 608 individually add the branch values $B_1$, $B_2$, $B_3$ and $B_4$ to the four state values $S_{P1}$, $S_{P2}$, $S_{P3}$ and $S_{P4}$ to generate four candidates. The candidates are sequentially sent to a comparison circuit 620 for cross comparison, and finally a flag #flag is generated to indicate which candidate is the maximum one. Simultaneously, the comparison circuit 620 calculates differences between the state values $S_{P1}$ versus the $S_{P2}$, $S_{P3}$ and $S_{P4}$ to generate difference values #D1, #D2 and #D3. The difference values are then sent to a lookup table 630, such that a logarithm correction value #C is looked up. On the other hand, the candidates are sequentially sent to a switch 610, whereby the maximum candidate is picked and passed to an adder 612 based on the flag #flag. Thereby, the adder 612 adds the maximum candidate with the logarithm correction value #C to obtain the state value $S_C$ of a current stage. In the embodiment, the memory device 410 stores the flag #flag, and the difference values #D1, #D2 and #D3. The state value $S_C$ at a current stage may be reused as an input to calculate state values at a next stage.

Figure 6B:
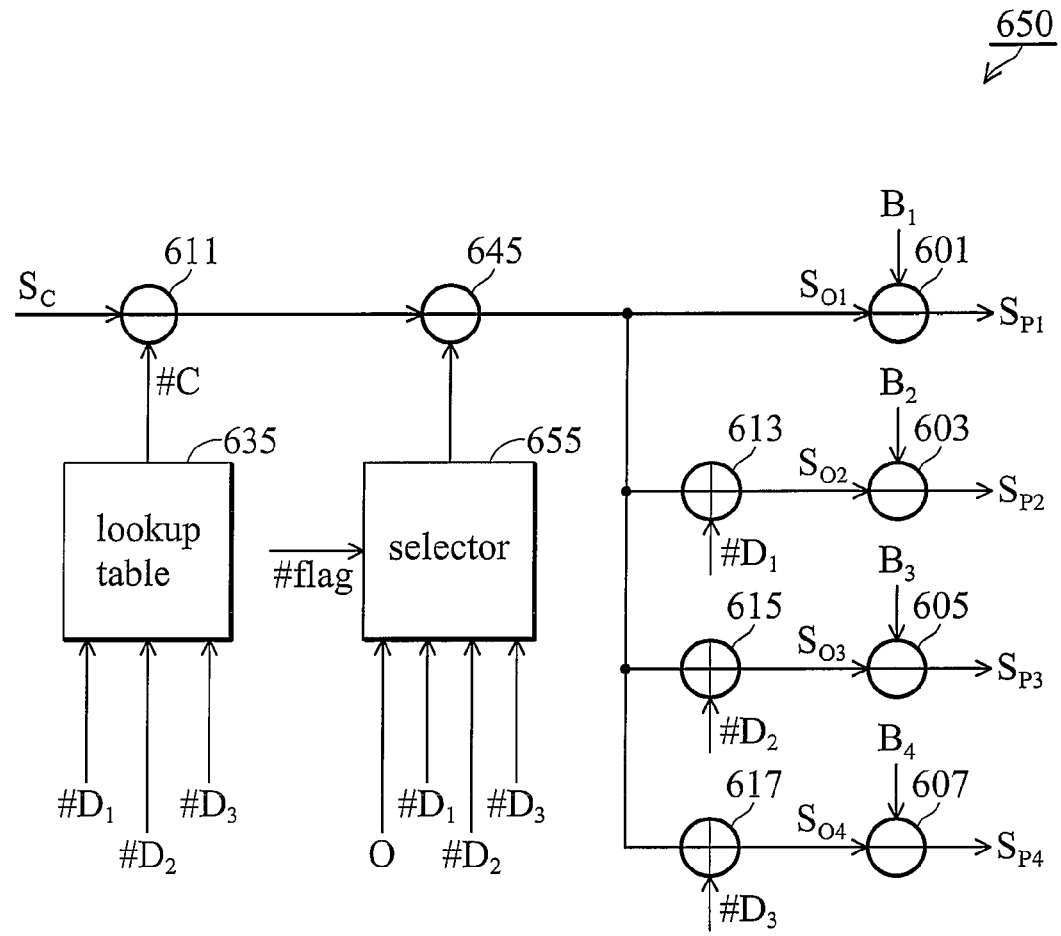
FIG. 6b shows an embodiment of a revival unit 650.

FIG. 6b shows an embodiment of a revival unit 650, having a structure symmetric to the ACS circuit 600. When a state value $S_C$ of a current stage is input, four state values $S_{P1}$, $S_{P2}$, $S_{P3}$ and $S_{P4}$ of a previous stage can be re-acquired based on the flag #flag and the difference values #D1, #D2 and #D3. Firstly, a lookup table 635 is looked up for a logarithm correction value #C based on the difference values #D1, #D2 and #D3. A subtractor 611 then subtracts the state value $S_C$ by the logarithm correction value #C to re-acquire the maximum candidate as mentioned in FIG. 6a. The subtractor 645 and selector 655 are used to re-acquire the candidate $S_{O1}$. The selector 655 determines the position where the maximum candidate is located based on the flag #flag. For example, if the maximum candidate is located at the topmost place, the candidate $S_{O1}$ is assessed as the maximum candidate, so the selector 655 outputs a zero value to the subtractor 645, such that the $S_{O1}$ is output as the maximum candidate. Likewise, if the maximum candidate is located at the second place, the selector 655 uses difference value #D1 to be subtracted with the maximum candidate, such that the $S_{O1}$ is output from the subtractor 645. When the candidate $S_{O1}$ is determined, other candidates $S_{O2}$, $S_{O3}$ and $S_{O4}$ can further be re-acquired by addition with the difference values #D1, #D2 and #D3 via the adders 613, 615 and 617. The subtractors 601, 603, 605 and 607 then eliminate the branch values $B_1$, $B_2$, $B_3$ and $B_4$ from the candidates $S_{O1}$, $S_{O2}$, $S_{O3}$ and $S_{O4}$ to re-acquire the state values of a previous stage $S_{P1}$, $S_{P2}$, $S_{P3}$ and $S_{P4}$.

In the embodiment of the circuit, four states of a previous stage can be re-acquired from one state of a current stage. If a state vector of one stage comprises eight states, the re-acquisition process would be processed twice per stage. The branch associations between each stage are previously defined by trellis code specification, among which only two states are required to sufficiently cover all stage elements of the adjacent stage. Data required for each circuit may only comprise a flag #flag and three difference values, with one dominant state value reused from a previous stage. Memory occupation is thereby significantly reduced in comparison to the prior art. A plurality of circuits can be provided to operate as parallel pipelines, and the number of circuits may be dependent on the number of states in each state vector.

Figure 7:
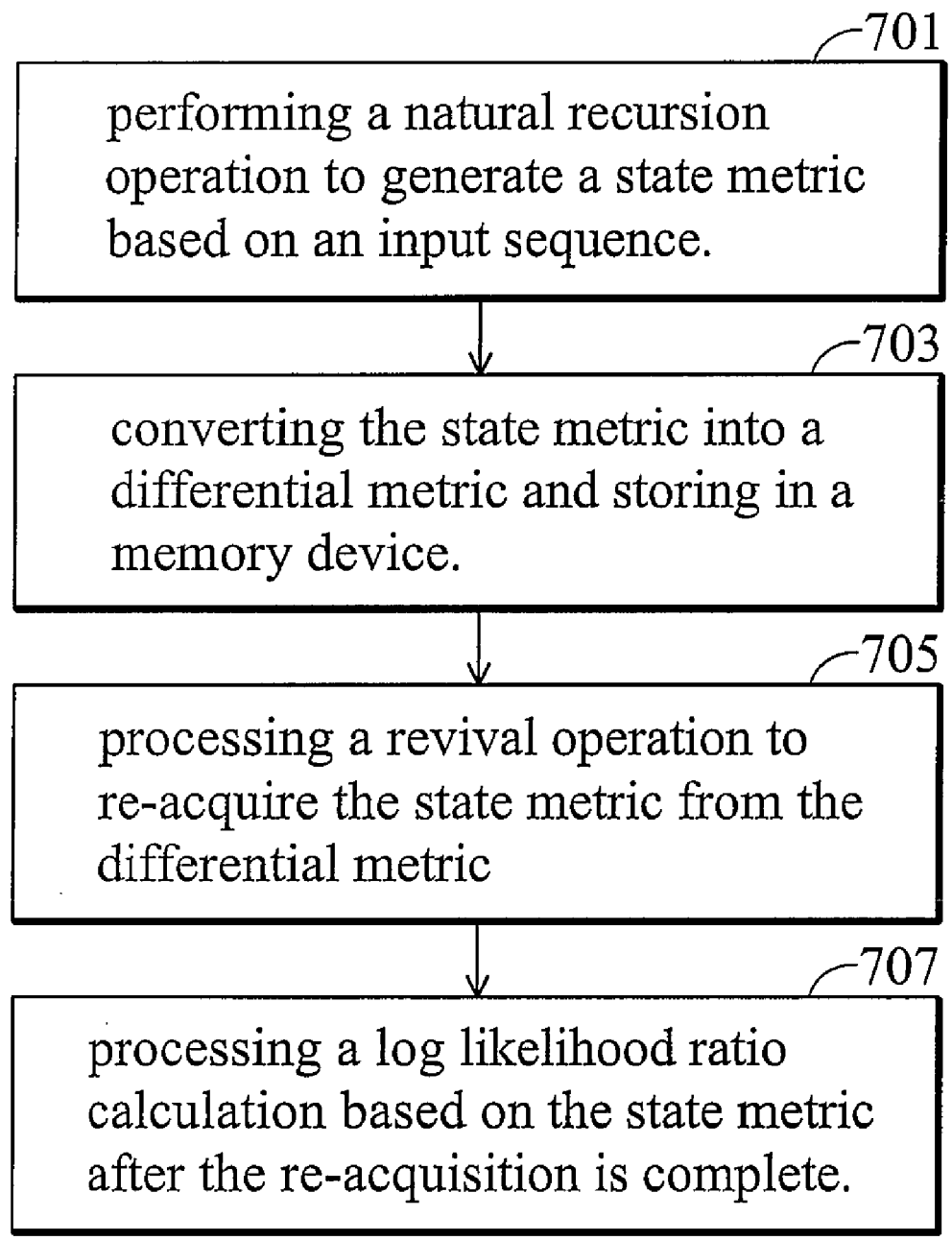
FIG. 7 is a flowchart of a track back calculation.

FIG. 7 is a flowchart of a trace back operation. The embodiments can be summarized as follows. In step 701, a natural recursion operation is performed to generate a state metric based on an input sequence. In step 703, the state metric is converted into a differential metric and stored in a memory device. In fact, the conversion is progressively processed, and the parameters may comprise probabilities α and β as specified in the MAP algorithm. In step 705, a revival operation is processed, whereby the differential metric is read from the memory device to re-acquire the state metric. Although some embodiments of circuits are provided, the invention is not limited thereto. In step 707, a log likelihood ratio calculation is processed based on the state metric after the re-acquisition is complete. In practice, the log likelihood ratio calculation may also be progressively processed while the re-acquisition is in process. In conclusion, the invention subsequently reduces memory occupation by 25%.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A turbo code decoder, comprising:
 a state processor, comprising a plurality of Add-Compare-Selection (ACS) units operating concurrently to perform a natural recursion operation on an input sequence to generate a state metric, and to convert the state metric into a differential metric;
 a memory device, coupled to the state processor for storing the differential metric;
 a plurality of revival units coupled to the state processor, operating concurrently to re-acquire the state metric from the differential metric; and
 a likelihood calculator coupled to the revival units, performing a log likelihood ratio (LLR) calculation based on the state metric, wherein the state metric is a radix-4 trellis structure or a radix-$2^2$ trellis structure.

2. The turbo code decoder as claimed in claim 1, wherein:
 the state metric comprises a plurality of state vectors each associated with a stage, and each state vector comprises a plurality of states; and
 the differential metric comprises a plurality of differential vectors each associated with a state vector, and each differential vector comprises:

at least one revival parameter for re-acquisition of a dominant state in the state vector; and a plurality of differential values to re-acquiring other states from the dominant state.

3. The turbo code decoder as claimed in claim 1, wherein when the revival unit re-acquires the state metric, a dominant state is first re-acquired from the revival parameter, and the other states are re-acquired based on the dominant state and the differential values.

4. The turbo code decoder as claimed in claim 3, wherein the natural recursion operation utilizes a log-maximum a posterior (Log-MAP) algorithm, a Maximum Log-MAP algorithm or an Enhanced Maximum Log-MAP algorithm.

5. The turbo code decoder as claimed in claim 4, wherein:
the state has a state value representing a forward probability; and
the revival unit recursively re-acquires each state vector in a backward order.

6. The turbo code decoder as claimed in claim 4, wherein:
the state has a state value representing a backward probability; and
the revival unit recursively re-acquires each state vector in a forward order.

7. The turbo code decoder as claimed in claim 4, wherein the likelihood calculator derives log likelihood ratios (LLRs) among the state metric.

8. The turbo code decoder as claimed in claim 7, wherein each ACS unit updates a state value of a current stage according to four states of a previous stage, comprising:
a first adder, adding a first state value and a first branch value to obtain a first value;
a second adder, adding a second state value and a second branch value to obtain a second value;
a third adder, adding a third state value and a third branch value to obtain a third value;
a fourth adder, adding a fourth state value and a fourth branch value to obtain a fourth value;
a first selector, coupled to the first and second adders, outputting the larger value among the first and second values, and a first difference value representing their difference;
a second selector, coupled to the third and fourth adders, outputting the larger value among the third and fourth values, and a second difference value representing their difference;
a third selector, coupled to the first and second selector, outputting the larger value among the output values therefrom, and a third difference value representing their difference;
a lookup table, looking up a logarithm correction value based on the first, second and third difference values; and
an adder, coupled to the third selector and the lookup table, adding the output from the third selector and the logarithm correction value to acquire the state value of a current stage.

9. The turbo code decoder as claimed in claim 8, wherein each revival unit re-acquires four state values of a previous stage based on the state value of a current stage, comprising:
a lookup table, looking up a logarithm correction value based on the first, second and third difference values
a subtractor, subtracting the state value of a current stage by the logarithm correction value;
a first selector, reading the third difference value and the output of the subtractor to obtain a first intermediate value and a second intermediate value;
a second selector, reading the first difference value and the first intermediate value to generate a first value and a second value;
a third selector, reading the second difference value and the second intermediate value to generate a third value and a fourth value;
a first subtractor, subtracting the first value by the first branch value to re-acquire the first state value;
a second subtractor, subtracting the second value by the second branch value to re-acquire the second state value;
a third subtractor, subtracting the third value by the third branch value to re-acquire the third state value; and
a fourth subtractor, subtracting the fourth value by the fourth branch value to re-acquire the fourth state value.

10. The turbo code decoder as claimed in claim 7, wherein each ACS unit updates a state value of a current stage according to four state values of a previous stage, comprising:
a first adder, adding a first state value and a first branch value to obtain a first value;
a second adder, adding a second state value and a second branch value to obtain a second value;
a third adder, adding a third state value and a third branch value to obtain a third value;
a fourth adder, adding a fourth state value and a fourth branch value to obtain a fourth value;
a comparator circuit, coupled to the first, second, third and fourth adders, deriving a first difference value, a second difference value and a third difference value respectively representing differences between the first value versus the second, third and fourth values, and outputting a flag indicating which value among the four values is the maximum value;
a selector, coupled to the first, second, third and fourth adders, selecting the maximum value among the four values based on the flag as an output;
a lookup table, looking up a logarithm correction value based on the first, second and third difference values; and
an adder, coupled to the selector and the comparator circuit, adding the output from the selector with the logarithm correction value to acquire the state value of a current stage.

11. The turbo code decoder as claimed in claim 10, wherein each revival unit re-acquires four state values of a previous stage based on the state value of a current stage, comprising:
a lookup table, looking up a logarithm correction value based on the first, second and third difference values;
a first subtractor, coupled to the lookup table, subtracting the state value of a current stage by the logarithm correction value;
a selector, selecting one value among the first difference, second difference, third difference and zero values as an output based on the flag;
a second subtractor, coupled to the subtractor and the second adder, re-acquiring the first value by subtraction of the outputs therefrom;
a first adder, coupled to the second subtractor, adding the first value with the first difference value to re-acquire the second value;
a second adder, coupled to the second subtractor, adding the first value with the second difference value to re-acquire the third value;
a third adder, coupled to the second subtractor, adding the first value with the third difference value to re-acquire the fourth value;

a third subtractor, coupled to the second subtractor, subtracting the first value by the first branch value to re-acquire the first state value;

a fourth subtractor, coupled to the first adder, subtracting the second value by the second branch value to re-acquire the second state value;

a fifth subtractor, coupled to the second subtractor, subtracting the third value by the third branch value to re-acquire the third state value;

a sixth subtractor, coupled to the third subtractor, subtracting the fourth value by the fourth branch value to re-acquire the fourth state value.

12. A turbo code decoding method, comprising:

performing a natural recursion operation on an input sequence to generate a state metric converting the state metric into a differential metric and storing the differential metric in a memory device;

performing a revival operation to read the differential metric from the memory to re-acquire the state metric; and performing a log likelihood ratio (LLR) calculation based on the state metric; wherein the state metric is a radix-4 trellis structure or a radix-22 trellis structure.

13. The turbo code decoding method as claimed in claim 12, wherein:

the state metric comprises a plurality of state vectors each associated with a stage, and each state vector comprises a plurality of states; and the differential metric comprises a plurality of differential vectors each associated with a state vector, and each differential vector comprises:

at least one revival parameter for re-acquisition of a dominant state in the state vector; and a plurality of differential values to re-acquire other states from the dominant state.

14. The turbo code decoding method as claimed in claim 13, wherein the revival operation comprises:

re-acquiring the dominant state from the revival parameter; and re-acquiring the other states based on the dominant state and the differential values.

15. The turbo code decoding method as claimed in claim 14, wherein the natural recursion operation utilizes a log-maximum a posterior (Log-MAP) algorithm, a Maximum Log-MAP algorithm or an Enhanced Maximum Log-MAP algorithm.

16. The turbo code decoding method as claimed in claim 15, wherein:

the state has a state value representing a forward probability or a backward probability; and the revival operation comprises recursively re-acquiring each state vector in a forward order or a backward order.

17. The turbo code decoding method as claimed in claim 16, wherein the likelihood calculation comprises deriving log likelihood ratios (LLRs) among the state metric.

18. The turbo code decoding method as claimed in claim 17, wherein the natural recursion operation comprises a plurality of concurrently processed ACS operations, and each ACS operation comprises:

adding a first state value and a first branch value to obtain a first value;

adding a second state value and a second branch value to obtain a second value;

adding a third state value and a third branch value to obtain a third value;

adding a fourth state value and a fourth branch value to obtain a fourth value;

assessing a larger value among the first and second values as a first candidate, and a first difference value representing their difference;

assessing a larger value among the third and fourth values as a second candidate, and a second difference value representing their difference;

assessing a larger value among the first and second candidates as a dominant value, and a third difference value representing their difference;

looking up a lookup table to acquire a logarithm correction value based on the first, second and third difference values; and adding the dominant value and the logarithm correction value to acquire the state value of a current stage.

19. The turbo code decoding method as claimed in claim 18, wherein the revival operation comprises:

looking up a lookup table to acquire a logarithm correction value based on the first, second and third difference values;

subtracting the state value of a current stage by the logarithm correction value to re-acquire the dominant value;

obtaining a first intermediate value and a second intermediate value from the third difference value and the dominant value;

reading the first difference value and the first intermediate value to generate a first value and a second value;

reading the second difference value and the second intermediate value to generate a third value and a fourth value;

subtracting the first value by the first branch value to re-acquire the first state value;

subtracting the second value by the second branch value to re-acquire the second state value;

subtracting the third value by the third branch value to re-acquire the third state value; and subtracting the fourth value by the fourth branch value to re-acquire the fourth state value.

20. The turbo code decoding method as claimed in claim 17, wherein the natural recursion operation comprises a plurality of concurrently processed ACS operations, and each ACS operation comprises:

adding a first state value and a first branch value to obtain a first value;

adding a second state value and a second branch value to obtain a second value;

adding a third state value and a third branch value to obtain a third value;

adding a fourth state value and a fourth branch value to obtain a fourth value;

deriving a first difference value, a second difference value and a third difference value respectively representing differences between the first value versus the second, third and fourth values; and outputting a flag indicating which value among the four values is the maximum value;

selecting the maximum value among the four values based on the flag as an output;

looking up a lookup table to obtain a logarithm correction value based on the first, second and third difference values; and adding the output with the logarithm correction value to acquire the state value of a current stage.

21. The turbo code decoding method as claimed in claim 20, wherein the revival operation comprises:

looking up a lookup table for a logarithm correction value based on the first, second and third difference values;

re-acquiring the first value based on the flag, the state value of a current stage and the logarithm correction value;

adding the first value with the first difference value to re-acquire the second value;

adding the first value with the second difference value to re-acquire the third value;

adding the first value with the third difference value to re-acquire the fourth value;

subtracting the first value by the first branch value to re-acquire the first state value;

subtracting the second value by the second branch value to re-acquire the second state value;

subtracting the third value by the third branch value to re-acquire the third state value;

subtracting the fourth value by the fourth branch value to re-acquire the fourth state value.

* * * * *